United States Patent
Kim

(10) Patent No.: US 6,577,190 B2
(45) Date of Patent: Jun. 10, 2003

(54) LINEAR GAIN CONTROL AMPLIFIER

(75) Inventor: Seong Ryeol Kim, Chungju (KR)

(73) Assignee: Hynix Semiconductor, Inc., Kyoungki-do (KR)

( * ) Notice: Subject to any disclaimer, the term of this patent is extended or adjusted under 35 U.S.C. 154(b) by 0 days.

(21) Appl. No.: 09/984,921

(22) Filed: Oct. 31, 2001

(65) Prior Publication Data

US 2002/0070802 A1 Jun. 13, 2002

(30) Foreign Application Priority Data

Oct. 31, 2000 (KR) ............................................. 00-64273

(51) Int. Cl.$^7$ ................................................. H03G 3/20
(52) U.S. Cl. ....................................... 330/133; 330/134
(58) Field of Search ................................. 330/133, 134, 330/254, 258, 279; 327/346, 350

(56) References Cited

U.S. PATENT DOCUMENTS 5,099,204 A    3/1992   Wheatley, III .............. 330/279
5,757,230 A  *  5/1998  Mangelsdorf ................ 330/133
5,867,063 A  *  2/1999  Snider et al. ................ 330/133

\* cited by examiner

*Primary Examiner*—Steven J. Mottola
(74) *Attorney, Agent, or Firm*—Birch, Stewart, Kolasch & Birch, LLP

(57) ABSTRACT

A wide band linear gain control amplifier for a mobile communications system, which can be easily implemented by standard CMOS fabrication processes for forming into an integrated circuit. The linear gain control amplifier is responsive to a basic control signal and includes a compensating circuit unit for outputting a gain-compensated first control voltage that is substantially stable against changes in temperature and changes in source voltage, and which has an exponential relation to the basic control signal, and for outputting a second control voltage associated with the first control signal; a variable gain amplification unit for gain-controlling an input signal according to the first control voltage to output an amplification signal and for keeping the gain of the amplification signal for the input signal substantially constant even if a source voltage changes; and a driving amplification unit for amplifying the amplification signal to a predetermined level.

18 Claims, 4 Drawing Sheets

US 6,577,190 B2

LINEAR GAIN CONTROL AMPLIFIER

RELATED APPLICATION

The present application claims the benefit of Korean Patent Application No. 64273/2000 filed Oct. 31, 2000, which is herein fully incorporated by reference.

BACKGROUND OF THE INVENTION

1. Field of the Invention

The present invention relates to a linear gain control amplifier, and more particularly, to a wide band linear gain control amplifier for a mobile communications system.

2. Description of the Background Art

FIG. 1 is a block diagram illustrating the construction of a conventional linear gain control amplifier. As illustrated therein, the linear gain control amplifier includes: a compensating circuit unit 10 for converting a control signal CTL inputted for linear gain control into a control voltage $V_{CTRL}$ having an exponential form; a first amplifier 20 for gain-controlling an input signal RF_IN according to the control voltage $V_{CTRL}$ to output an amplification signal AMP_OUT; a surface acoustic wave filter 30 for filtering any distortions in the amplification signal AMP_OUT and any noise present therein; and a second amplifier 40 for gain-controlling an output of the filter 30 according to the control voltage $V_{CTRL}$ to output a compensating signal RF_OUT.

Here, as illustrated in FIG. 2, the first amplifier 20 includes: a low-pass filter unit 21 for filtering a low frequency of a control voltage $V_{CTRL}$ to output a DC component; a high-pass filter unit 22 for filtering a high frequency of an input signal RF_IN; a capacitor C3 and inductor L1 for matching the input signal RF_IN inputted via the high-pass filter unit 22 and an input impedance; an amplification control transistor 23 for amplifying a high-pass filtered input signal to a predetermined level and controlling the gain of an amplification signal AMP OUT by the DC component from the control voltage $V_{CTRL}$; a tank circuit unit 24 for applying a predetermined DC level voltage to the amplification signal AMP_OUT and matching the amplification signal AMP_OUT and a predetermined output impedance; and a bypass circuit unit 25 for removing an AC component applied to the amplification control transistor 23. The second amplifier 40 can be constructed to be the same as the first amplifier 20, while the filter 30 can be a surface acoustic wave filter.

The operation of the conventional gain control amplifier will now be described.

First, the compensating circuit unit 10 compensates an externally inputted control signal CTL so that the control signal output characteristics are exponentially approximated for thereby outputting a predetermined control voltage $V_{CTRL}$. This is to linearize the gain characteristics of each amplifier 20 and 40 for the control voltage $V_{CTRL}$ by making the previously gain-compensated control voltage $V_{CTRL}$ have exponential characteristics, since the gain characteristics of each amplifier 20 and 40 for the control voltage are logarithmic.

The first amplifier 20 gain-controls an input signal RF_IN according to a control voltage $V_{CTRL}$ applied from the compensating circuit unit 10, to thus output an amplification signal AMP_OUT to the filter 30. The filter 30 filters any distortions in the amplification signal AMP_OUT and any noise present therein, to thereby output a filtered signal to the second amplifier 40. Then, the second amplifier 40 gain-controls the filtered signal again for thereby outputting a compensating signal RF_OUT.

Here, with the respect to the operation of each amplifier 20 and 40, when an input signal RF_IN is applied to the first amplifier 20, the high-pass filter unit 22 filters a high frequency of the applied input signal RF_IN, and the capacitor C3 and inductor L1 matches the input impedance of the filtered input signal RF_IN, thus minimizing a loss generated during inputting of a signal.

The amplification control transistor 23 is controlled by an output RF_IN of the high-pass filter unit 22 applied to an input gate G2, for thereby amplifying the output RF_IN to a predetermined level according to a set gain and thereafter outputting an amplification signal AMP_OUT. The above amplification control transistor 23 can be a transistor device having a dual-gate structure G1, G2 as shown in FIG. 2.

At this time, the low-pass filter unit 21 receives the compensated control voltage $V_{CTRL}$ output from the compensating circuit unit 10 and filters a low frequency thereof, for thereby applying a DC component to a control gate G1 of the amplification control transistor 23. As such, the gain of the amplification control transistor 23 is controlled according to the voltage applied to the control gate G1 for thereby outputting the compensated amplification signal AMP_OUT to the filter 30.

Here, since the amplification signal AMP_OUT has a high output level, the tank circuit unit 24 is added to an output terminal in order to use the source voltage VCC as a bias voltage. The tank circuit unit 24 employs a resistor R4, a capacitor C5, and an inductor L2 having particular values so that the first amplifier 20 has a desired output impedance in order to match an impedance of the filter 30.

In addition, the bypass circuit unit 25 serves to remove an AC component applied to the amplification control transistor 23. Input and output impedance are controlled to a predetermined level by making each capacitor C3, C4, and C5 to have variable characteristics.

As described above, the conventional linear gain control amplifier is allowed to have a wide gain variable range by using the first and second amplifiers 20 and 40, and allowed to have the linearity of the first and second amplifiers 20 and 40 with gain characteristics for a control voltage by exponentially compensating a control signal CTL by the gain compensating unit 10.

However, since the above-described conventional linear control amplifier includes a surface acoustic wave filter (filter 30), as well as an inductor and variable capacitors, it is difficult to make the conventional linear control amplifier into an integrated circuit (IC). Also, the necessary inductor cannot be easily formed by standard CMOS processes. Furthermore, an additional process is required to implement the necessary variable capacitors. These drawbacks result in undesirably increased fabrication costs incurred in semiconductor chip manufacturing.

SUMMARY OF THE INVENTION

Accordingly, the present invention provides a linear gain control amplifier, which can be easily implemented and formed by standard CMOS processes and can be made into an integrated circuit (IC).

The linear gain control amplifier according to an embodiment of the present invention includes a compensating circuit unit for generating a first compensation control voltage having an exponential relation to a received basic control signal, and also for generating a second control voltage associated with the first control voltage; a variable gain amplification unit for varying a gain by the compensated control voltage; and a driving amplification unit for amplifying a signal inputted from the variable gain amplification unit to an output signal of a desired size.

Advantages of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become better understood with reference to the accompanying drawings, which are given only by way of illustration and thus are not limitative of the present invention, wherein.

DETAILED DESCRIPTION OF THE PREFERRED EMBODIMENTS

The preferred embodiment of the present invention will now be described with reference to the accompanying drawings.

Figure 1:
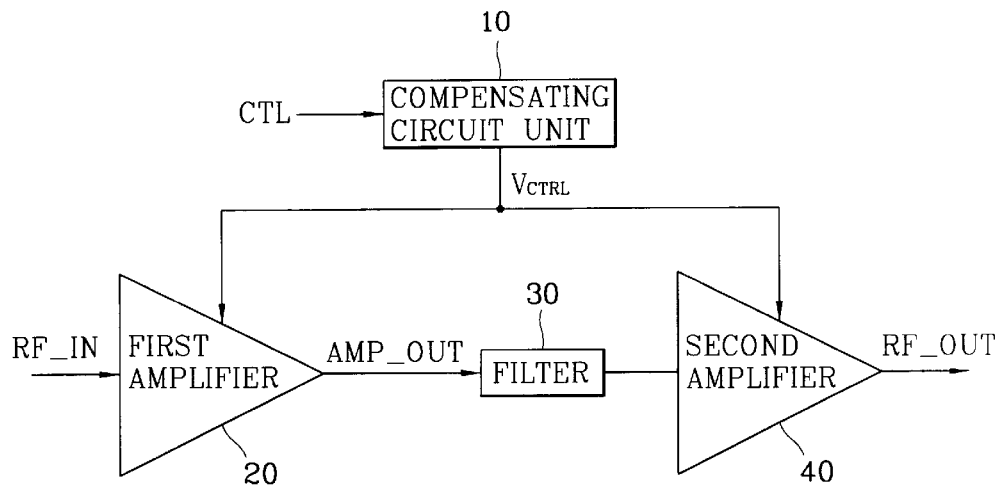
FIG. 1 is a block diagram illustrating the construction of a conventional linear control amplifier.
Figure 2:
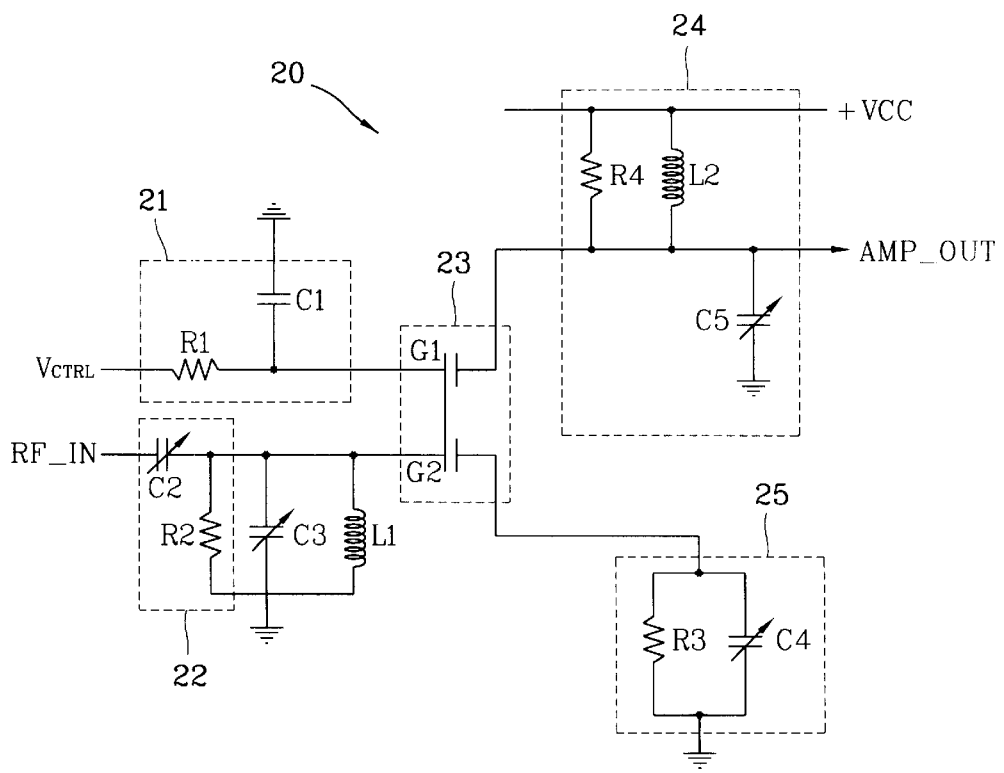
FIG. 2 is a circuit diagram illustrating the construction of the first and second amplifiers shown in FIG. 1.
Figure 3:
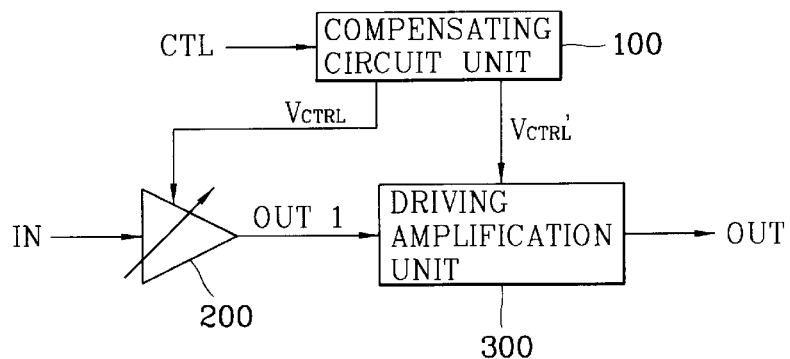
FIG. 3 is a block diagram illustrating the construction of a linear gain control amplifier according to an embodiment of the present invention.

FIG. 3 is a block diagram illustrating the construction of a linear gain control amplifier according to a first embodiment of the present invention. As illustrated therein, the linear gain control amplifier includes: a compensating circuit unit 100 for outputting, according to a control signal CTRL, both a gain-compensated, first control voltage $V_{CTRL}$ that is substantially stable against changes in temperature and changes in source voltage, and that has an exponential relation to the control signal CTRL, and a second control voltage $V_{CTRL}'$ associated with the first control signal $V_{CTRL}$; a variable gain amplification unit 200 for gain-controlling an input signal IN according to the first control voltage $V_{CTRL}$ to output an amplification signal OUT1 and for keeping the gain of the amplification signal OUT1 for the input signal IN constant, even if a source voltage VDD in the compensating circuit unit 100 changes; and a driving amplification unit 300 for amplifying the amplification signal OUT1 to a predetermined level and outputting a final output signal OUT.

Figure 4:
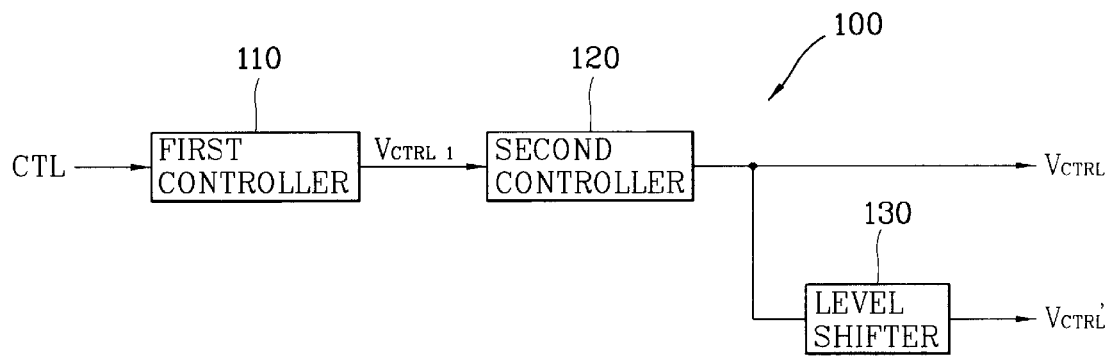
FIG. 4 is a block diagram illustrating the schematic construction of a compensating circuit unit shown in FIG. 3.

Here, a preferred embodiment of the compensating circuit unit 100 is illustrated in FIG. 4.

Figure 5:
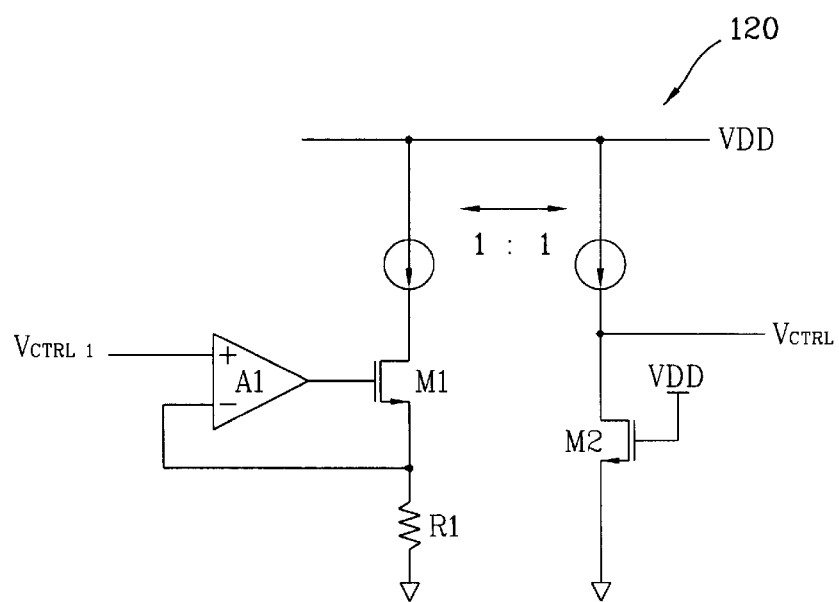
FIG. 5 is a circuit diagram illustrating a first embodiment of a second controller shown in FIG. 4.

As illustrated therein, the compensating circuit unit 100 includes: a first controller 110 for gain-compensating an inputted control signal CTL to transform it into a third control voltage $V_{CTRL1}$, the transformation approximating an exponential function; a second controller 120 that compensates for changes in the output characteristics of the variable gain amplification unit 200 by providing a first control voltage $V_{CTRL}$ of a predetermined level; and a level shifter 130 for shifting the value of the first control voltage $V_{CTRL}$ to a predetermined level to output a second control voltage $V_{CTRL}'$. The second controller 120 has a circuit construction as shown in FIG. 5.

Figure 6:
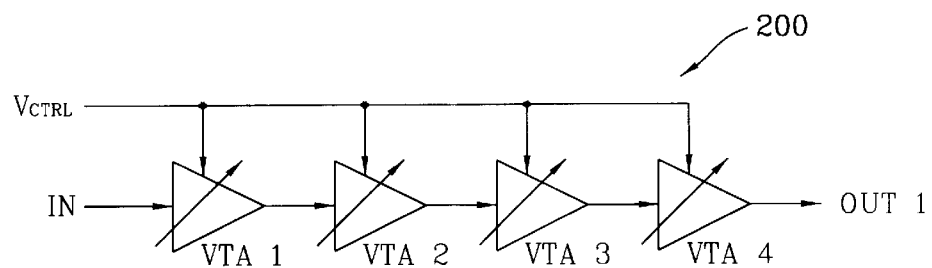
FIG. 6 is a block diagram illustrating a first embodiment of a variable mutual conductance amplification unit shown in FIG. 3.

In addition, as illustrated in FIG. 6, the variable gain amplification unit 200 can be constructed by cascade-connecting a plurality of VTA (Variable Transconductance Amplifier) cells VTA1 through VTA4.

Figure 7:
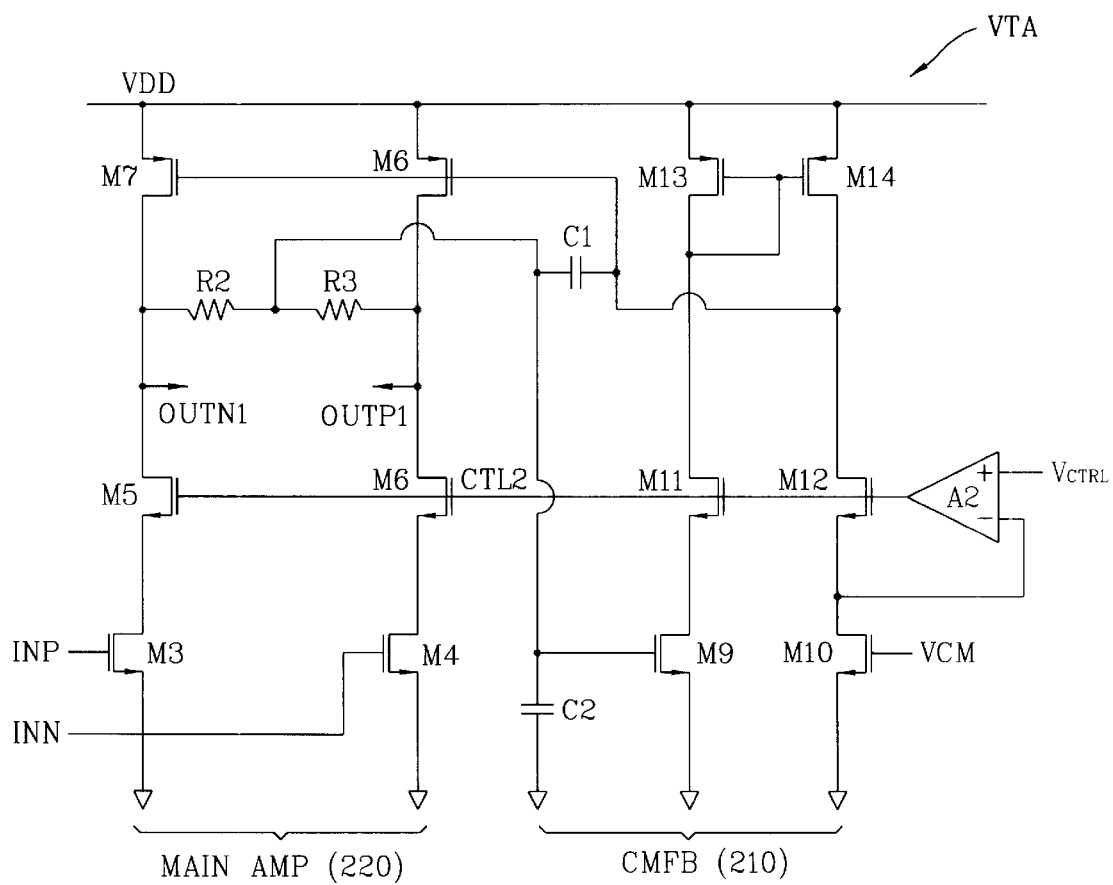
FIG. 7 is a circuit diagram illustrating the construction of each variable transconductance amplifier (VTA) cell shown in FIG. 6.

As illustrated in FIG. 7, each VTA cell includes: a common mode feedback unit (CMFB) 210 for outputting the first control voltage applied by the compensating circuit unit as an amplification control signal CTL2 for controlling the gain of a main amplification unit 220, and tracking a constant voltage VCM to a DC reference voltage; and the main amplification unit 220 for determining a DC level of an output signal according to the tracked DC reference voltage and amplifying an input signal (INP, INN) by being controlled by the amplification control signal CTL2.

The CMFB 210 provides a predetermined voltage for gain-control to the main amplification unit 220 upon receipt of a first control voltage $V_{CTRL}$ applied from the compensating circuit unit 100 while at the same time tracking a common mode voltage VCM to a DC reference voltage. The main amplification unit 220 determines a DC level of an output signal OUT1 (OUTN1 and OUTP1) by the common mode voltage and sequentially amplifies an input signal IN (INP and INN) to a predetermined level under control of the amplification control signal CTL2. The INP (positive IN) and INN (negative IN) represent a differential input signal IN, and have a 180° phase difference from each other. Similarly, the OUTN (positive OUT) and OUTP (negative OUT) represent a differential output signal OUT, and have a 180° phase difference from each other.

Figure 8:
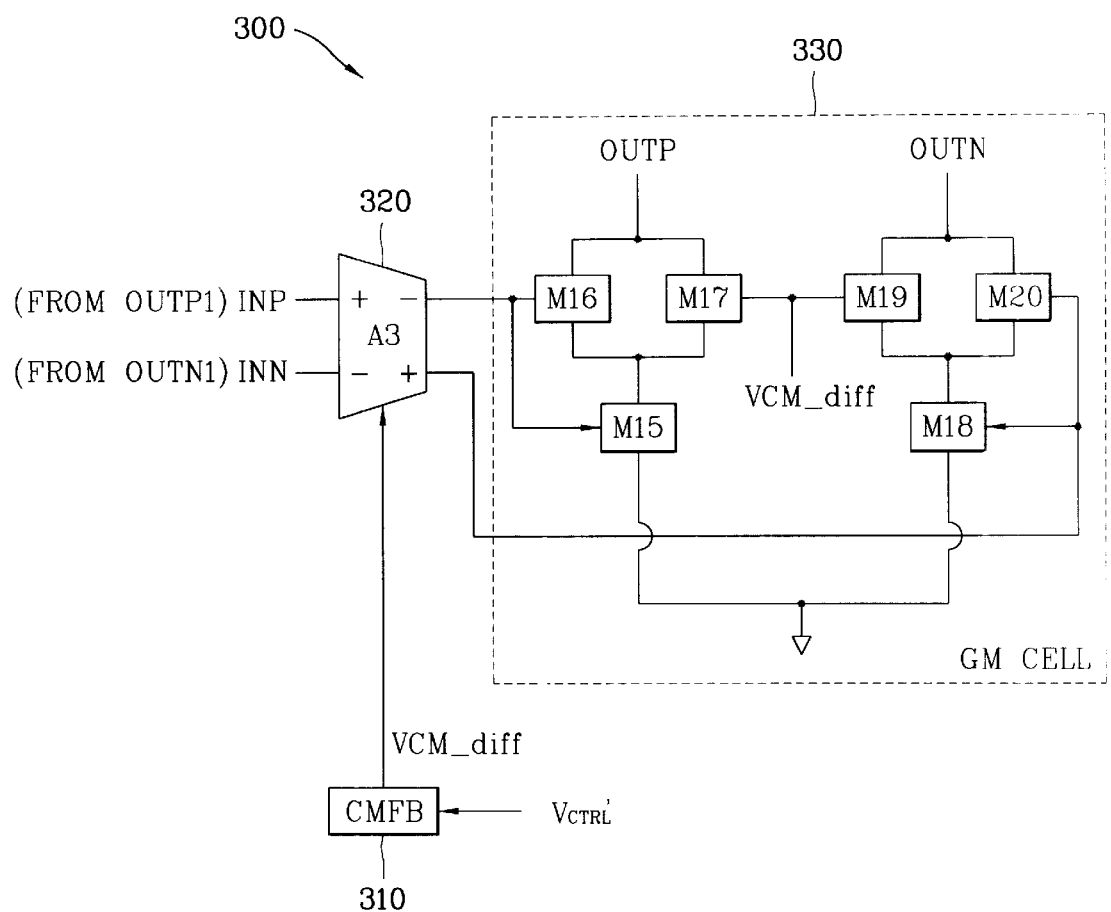
FIG. 8 is a block diagram illustrating a first embodiment of a driving amplification unit shown in FIG. 3.

In addition, as illustrated in FIG. 8, the driving amplification unit 300 includes a differential amplifier A3 (320), a gm cell 330 including mutual conductance cells M15 through M20, and another common mode feedback block CMFB (310). The output signal OUT1 (OUTP1 and OUTN1) is input to the differential amplifier A3 of the driving amplification unit 300 as input signals INP and INN. These signals are then processed by the driving amplification unit 300 and output as the final out signal OUT (OUTP and OUTN).

The operation of the thusly constructed linear gain variable amplifier according to the preferred embodiment of the present invention will now be described.

When a control signal CTL is inputted from the outside, the compensating circuit unit 100 compensates the control signal CTL to output a control voltage $V_{CTRL}$ having exponential characteristics to the variable gain amplification unit 200 and to also output a further-biased signal $V_{CTRL}$ to the driving amplification unit 300.

The variable gain amplification unit 200 operates as a linear gain amplifier having a wide dynamic range upon receipt of the first control voltage $V_{CTRL}$ applied from the compensating circuit unit 100.

For this purpose, as illustrated in FIG. 4, in the compensating circuit unit 100, the first controller 110 generates a voltage $V_{CTRL1}$ by using an external input control voltage CTL as an exponential function available in the range in which a circuit operation is possible. If the variable gain amplification unit 200 were operated using only the thusly generated voltage $V_{CTRL1}$ as a control voltage, its gain would be linearly changed, and as such would become sensitive to changes in signal process, temperature, power, etc.

Therefore, in order to compensate for this, the second controller 120 is provided. The second controller 120, as illustrated in FIG. 5, generates a control voltage $V_{CTRL}$ that, in effect, negatively feeds back changes in the control voltage $V_{CTRL1}$ to make the gain of the variable gain amplification unit 200 more stable.

In other words, in FIG. 7, the gm (transconductance) value of cells M3 and M4, load resistance of R2 and R3, and the VDS voltage of M3 and M4 determines the gain of the VTA cell. That is, the VTA cell receives the differential input voltage (INP and INN) and outputs the differential output voltage (OUTP and OUTN), whereby its voltage gain can be determined. Here, since the VDS voltage of M3 and M4 would become approximately identical to the control voltage $V_{CTRL1}$ by an internal CMFB circuit, the gain of the VTA cell would be as follows.

[Mathematical Expression 1]

$$\text{VTA cell gain} \approx 20 \, log \, [\mu_n C_{ox}(W/L)_{M3} \cdot R2 \cdot V_{CTRL}]$$

where $\mu_n$ represents mobility of an NMOS transistor, $C_{ox}$ represents a capacitance of oxide, and $(W/L)_{M3}$ is a ratio of L (length) and W (width) of the cell $M_3$.

At this time, the output voltage $V_{CTRL}$ of the second controller 120 is as follows.

[Mathematical Expression 2]

$$VCTRL \approx \frac{V_{CTRL1}}{\mu_n C_{ox}(W/L)_{M2} \cdot Vds.sat.M2 \cdot R1}$$

According to this equation, it can be understood that the main factors effecting the gain change of the VTA cell, e.g., $\mu_n$, R, and size (W/L) of the channel, are changed into a proportional constant. In this equation, the Vds.sat.M2 value results in a relatively smaller gain change compared to the aforementioned three factors.

In this way, a signal output having obtained a wide gain variable range and a stable gain through the variable gain amplification unit 200 is input to the driving amplification unit 300 in order to generate a large output for a signal transmitter usable in a mobile communications system or other systems.

As illustrated in FIG. 8, an inputted signal is amplified by the differential amplifier A3 to a certain extent, and thereafter enters the gm cell 330 including an open drain. The gm cell 330 receives the output voltage of the differential amplifier A3 and outputs the differential output current (OUTP and OUTN) in accordance with the VCM_diff voltage output from the CMFB 310. In a simple term, the gm cell 330 receives a certain voltage and outputs a certain electrical current because of its transconductance characteristics. In this manner, the gm cell 330 generates a current usable for driving an external load resistance, that resistance being a value of less than 1 kΩ for impedance matching with an external filter. The CMFB generates and outputs the VCM_diff voltage signal to the differential amplifier A3 and the gm cell 330 based on $V_{CTRL}'$.

Particularly, when the driving amplification unit 300 receives the signals OUTP1 and OUTN1 outputted from the variable gain amplification unit 200, the CMFB 310 of the driving amplification unit 300 outputs a VCM_diff voltage signal for gain-controlling the differential amplifier 320 based on the second control voltage ($V_{CTRL}'$) outputted from the compensating circuit unit 100. And the differential amplifier 320 amplifies the inputted signal (OUTP1, OUTN1) according to the VCM_diff voltage signal. The gm cell 330 receives the voltage outputted from the differential amplifier 320 and outputs the currents (OUTP and OUTN) amplified according to the VCM_diff voltage signal.

Therefore, in order to obtain a large output with a low load resistance, current consumption is inevitably large. In the present invention, the output DC of the differential amplifier A3 is identical to the input DC of the gm cell 330. A VCM_diff voltage identical to that of the differential amplifier A3 is used as a gain variable voltage of the gm cell 330. In addition, the power consumption is allowed to effectively change according to gain by using the $V_{CTRL1}'$ voltage operating in relation to the $V_{CTRL}$ voltage.

The mutual conductance cells M16 through M20 prevent isolation characteristics and external load resistance from affecting internal impedance by ensuring that M15 operates in a triode region, and increasing internal impedance in the open drain.

As described above, according to the present invention, it is possible to obtain a high gain irrespective of changes in source voltage. Also, a large output can be obtained without distortion even at a low source voltage, because the gain range of the linear gain control amplifier can be easily adjusted by linearly controlling the gain of an input signal using a compensated voltage and load resistance outputted from the compensating circuit unit, and controlling a linear region of each amplification unit using a common mode voltage of its front end.

In addition, the linear gain control amplifier of the present invention is composed of elements that are capable of being easily integrated. As such, an on-chip ground base under the standard CMOS process can be achieved. Thus, manufacturing costs can be reduced, and the integration of the linear gain amplifier with peripheral applications can be easily achieved by CMOS processes. Also, the gain characteristics of the linear gain control amplifier according to the present invention are very stable because a feedback control voltage is used.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A linear gain control amplifier comprising:
    a compensating circuit for receiving a basic control signal and outputting a gain-compensated first control voltage and a second control voltage associated with the first control voltage, the first control voltage being substantially stable against changes in temperature and changes in source voltage, the first control voltage also having an exponential relationship to the basic control signal;
    a variable gain amplification unit for receiving an input signal and gain-controlling the input signal according to the first control voltage from the compensating circuit to output an amplification signal, and for maintaining a gain of the amplification signal related to the input signal to be substantially constant even if a source voltage of the compensating circuit changes; and a driving amplification unit for receiving the second control voltage and amplifying the amplification signal from the variable gain amplification unit into a predetermined high level signal.

2. The amplifier according to claim 1, wherein the compensating circuit comprises:

a first controller for outputting a third control voltage obtained by approximating the basic control signal to an exponential function;

a second controller, responsive to the third control voltage, for outputting the first control voltage at a predetermined level to compensate for changes in the output of the variable gain amplification unit; and a level shifter for outputting the second control voltage by shifting a value of the first control voltage by a predetermined amount.

3. The amplifier according to claim 1, wherein the variable gain amplification unit is constructed by cascade connecting a plurality of variable transconductance amplifiers (VTAs).

4. The amplifier according to claim 3, wherein at least one of the VTAs comprises:

a common mode feedback block (CMFB) for outputting an amplification control signal for gain-controlling a main amplification unit based on the first control voltage from the compensating circuit, and tracking a common mode voltage (VCM) using a direct current (DC) reference voltage; and the main amplification unit for determining a direct current (DC) level of an output signal according to the DC reference voltage, and amplifying an input signal according to the amplification control signal.

5. The amplifier according to claim 1, wherein the driving amplifier comprises a differential amplifier performing a pre-amplification function and a gm cell having an open drain.

6. The amplifier according to claim 5, wherein the control voltage of the gm cell is also used as the common mode voltage (VCM) of the differential amplifier.

7. The amplifier according to claim 6, wherein the common mode voltage (VCM) is used as a voltage associated with the first control voltage.

8. A linear gain control amplifier comprising:

a compensating circuit to receive a basic control signal and output a first control voltage and a second control voltage;

a first amplifier to receive an input signal and to control a gain of the input signal in accordance with the first control voltage; and a second amplifier to amplify the gain-controlled input signal received from the first amplifier in accordance with the second control voltage, the first control voltage and the second control voltage being different from each other, and the first control voltage having an exponential relationship to the basic control signal.

9. The amplifier of claim 8, wherein the linear gain control amplifier does not include a surface acoustic wave filter between the first amplifier and the second amplifier.

10. The amplifier of claim 8, wherein the compensating circuit comprises:

a first controller to compensate a gain of the input signal and to output a third control voltage having an exponential relation to the basic control signal; and a second controller to receive the third control voltage and to output the first control voltage, the first control voltage representing compensation for changes in output characteristics of the second amplifier.

11. The amplifier of claim 10, wherein the second controller comprises:

a first circuit comprising, including a first transistor having a source receiving a common substantially constant source voltage via a first substantially constant current source, a gate, and a drain being grounded via a resistor, and a differential amplifier having a positive input terminal receiving the third control voltage from the first controller, a negative input terminal connected with the drain of the first transistor, and an output terminal connected with the gate of the first transistor; and a second circuit comprising a second transistor having a source receiving the common substantially constant source voltage via a second substantially constant current source, a gate of the second transistor also receiving the common constant voltage source, and a drain being grounded, wherein the source of the second transistor represents a node at which the first control voltage is available.

12. The amplifier of claim 8, wherein the first amplifier comprises a plurality of variable transconductance amplifiers (VTAs) connected together in cascade.

13. The amplifier of claim 12, wherein at least one of the VTAs comprises:

a common mode feedback block (CMFB) for outputting an amplification control signal for gain control, and tracking a common mode voltage (VCM) using a direct current (DC) reference voltage; and a main amplification unit for determining a direct current (DC) level of an output signal according to the DC reference voltage, and amplifying an input signal to a predetermined level according to the control voltage output from CMFB.

14. The amplifier of claim 8, wherein the second amplifier comprises:

a differential amplifier performing a pre-amplification function in accordance with the second control voltage; and a plurality of mutual conductance cells connected with the outputs of the differential amplifier to amplify the gain-controlled input signal received from the first amplifier.

15. The amplifier according to claim 8, wherein the first amplifier does not include an inductor.

16. The amplifier according to claim 1, wherein the linear gain control amplifier is formed entirely of CMOS technology.

17. The amplifier according to claim 8, wherein the linear gain control amplifier is formed entirely of CMOS technology.

18. The amplifier of claim 10, wherein the compensating circuit further comprises a level shifter to output the second control voltage as a shifted version of the first control voltage.

* * * * *